(12) United States Patent
Gallatin et al.

(10) Patent No.: US 7,010,776 B2
(45) Date of Patent: Mar. 7, 2006

(54) EXTENDING THE RANGE OF LITHOGRAPHIC SIMULATION INTEGRALS

(75) Inventors: Gregg M. Gallatin, Newtown, CT (US); Emanuel Gofman, Haifa (IL); Kafai Lai, Poughkeepsie, NY (US); Mark A. Lavin, Katonah, NY (US); Maharaj Mukherjee, Wappingers Falls, NY (US); Dov Ramm, Menashe (IL); Alan E. Rosenbluth, Yorktown Heights, NY (US); Shlomo Shlafman, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 175 days.

(21) Appl. No.: 10/694,466

(22) Filed: Oct. 27, 2003

(65) Prior Publication Data

US 2005/0091631 A1 Apr. 28, 2005

(51) Int. Cl.
*G06F 17/50* (2006.01)
(52) U.S. Cl. .............................. 716/19; 716/20; 703/2; 382/144
(58) Field of Classification Search ............ 716/19–21; 703/2, 5, 13; 382/144; 430/5
See application file for complete search history.

(56) References Cited

U.S. PATENT DOCUMENTS

| 5,644,390 | A | 7/1997 | Yasuzato |
| 5,647,027 | A | 7/1997 | Burges et al. |
| 5,680,588 | A | 10/1997 | Gortych et al. |
| 6,127,071 | A | 10/2000 | Lu |
| 6,223,139 | B1 * | 4/2001 | Wong et al. .................... 703/5 |
| 6,233,056 | B1 | 5/2001 | Naulleau et al. |
| 6,263,299 | B1 | 7/2001 | Aleshin et al. |
| 6,289,499 | B1 | 9/2001 | Rieger et al. |
| 6,303,253 | B1 * | 10/2001 | Lu ................. 430/5 |
| 6,415,421 | B1 | 7/2002 | Anderson et al. |
| 6,425,113 | B1 | 7/2002 | Anderson et al. |
| 6,449,387 | B1 | 9/2002 | Inui |
| 6,453,457 | B1 | 9/2002 | Pierrat et al. |
| 6,460,997 | B1 | 10/2002 | Frey et al. |
| 6,487,696 | B1 | 11/2002 | Gudmundsson et al. |
| 6,757,645 | B1 * | 6/2004 | Chang et al. ................. 703/13 |
| 2002/0062206 | A1 | 5/2002 | Liebchen |
| 2002/0126267 | A1 | 9/2002 | Smith |
| 2002/0159040 | A1 | 10/2002 | Hamatani et al. |
| 2005/0015233 | A1 * | 1/2005 | Gordon ....................... 703/13 |

* cited by examiner

*Primary Examiner*—Vuthe Siek
(74) *Attorney, Agent, or Firm*—DeLio & Peterson, LLC; Robert Curcio; Steven A. Capella

(57) ABSTRACT

A method for calculating long-range image contributions from mask polygons. An algorithm is introduced having application to Optical Proximity Correction in optical lithography. A finite integral for each sector of a polygon replaces an infinite integral. Integrating over two triangles, rather than integrating on the full sector, achieves a finite integral. An analytical approach is presented for a power law kernel to reduce the numerical integration of a sector to an analytical expression evaluation. The mask polygon is divided into regions to calculate interaction effects, such as intermediate-range and long-range effects, by truncating the mask instead of truncating the kernel function.

30 Claims, 12 Drawing Sheets

The 8 partitions

Domain with pattern density $P_n$

Evaluation box

EXTENDING THE RANGE OF LITHOGRAPHIC SIMULATION INTEGRALS

CROSS-REFERENCE TO RELATED APPLICATIONS

The present application is related to commonly assigned U.S. patent application Ser. Nos. 10/694,465, 10/694,473, 10/694,339, and 10/694,299, filed on even date herewith, which are hereby incorporated by reference herein in their entirety.

BACKGROUND Of THE INVENTION

1. Field of the Invention

This invention relates generally to the field of optical microlithography, and particularly to the use of triangle convolution to a sector-based OPC engine. More particularly, the invention relates to the use of triangle convolution on unbounded sectors, which inherently regularize the convolution of an intermediate-range, long-range, or infinitely extending kernel without spatially truncating the kernel, nor requiring excessive ROI size.

2. Description of Related Art

The optical microlithography process in semiconductor fabrication, also known as the photolithography process, consists of duplicating desired circuit patterns as best as possible onto a semiconductor wafer. The desired circuit patterns are typically represented as opaque and transparent regions on a template commonly called a photomask. In optical microlithography, patterns on the photomask template are projected onto photoresist-coated wafers by way of optical imaging through an exposure system.

Aerial image simulators, which compute the images generated by optical projection systems, have proven to be a valuable tool to analyze and improve the state-of-the-art in optical lithography for integrated circuit fabrications. These simulations have found application in advanced mask design, such as phase shifting mask (PSM) design, optical proximity correction (OPC), and in the design of projection optics. Modeling aerial images is a crucial component of semiconductor manufacturing. Since present lithographic tools employ partially coherent illumination, such modeling is computationally intensive for all but elementary patterns. The aerial image produced by the mask, i.e., the light intensity in an optical projection system's image plane, is a critically important quantity in microlithography for governing how well a developed photoresist structure replicates a mask design.

Mathematical difficulties arise in optical proximity correction calculations that, in part, can be attributed to divergence issues when attempting to analytically express imaging kernels over the unbound sectors into which mask polygons are conventionally decomposed. Attempts to account for incoherent flare are also subject to these analytical restrictions.

Accuracy is of critical importance in the computation of calibrated optical or resist models. The accuracy in the simulation of wafer shapes is necessary for a better understanding and evaluation of the correction methodologies. Through analytical processes, fidelity in the wafer shapes to the "as intended" shapes may ultimately achieve better correction of the mask shapes. An increase in yield during chip manufacturing is a direct consequence of achieving this accuracy.

The present invention introduces the utilization of triangle convolution to a sector-based optical proximity correction engine. Using triangles in the mathematical model to eliminate the difficulties of unbounded corners allows for integrals that accommodate intermediate-range and long-range effects.

In the prior art, the following mathematical treatment in the optical proximity correction engine is commonly used. These approaches are all, in one form or another, related to the Sum of Coherent Source (SOCS) method, which is an algorithm for efficient calculation of the bilinear transform.

Sum of Coherent Source (SOCS) Method

The image intensity is given by the partially coherent Hopkin's equation (a bilinear transform):

$$I_0(\vec{r}) = \iiint d\vec{r}' dr'' h(\vec{r}-\vec{r}')h^* (\vec{r}-\vec{r}'')j(\vec{r}'-\vec{r}'')m(\vec{r}')m^*(\vec{r}''),$$

where, h is the lens point spread function (PSF);
j is the coherence;
m is the mask; and
$I_0$ is the aerial image.

By using the SOCS technique, an optimal n-th order coherent approximation to the partially coherent Hopkin's equation can be expressed as $$I_0(\vec{r}) \cong \sum_{k=1}^{n} \lambda_k |(m \otimes \phi_k)(x)|^2$$

Where $\lambda_k, \phi_k(\vec{r})$ represents the eigenvalues and eigenvectors derived from the Mercer expansion of:

$$W(\vec{r}',r'') = h(\vec{r}')h^*(r'')j(\vec{r}'-r'') = \sum_{k=1}^{\infty} \lambda_k \phi_k(\vec{r}')\phi_k(\vec{r}''),$$

which suggests that a partially coherent imaging problem can be optimally approximated by a finite summation of coherent imaging, such as linear convolution.

SOCS with Pupil Phase Error

The above calculation assumes an ideal imaging system. However, when lens aberration is present, such as pupil phase error and apodization, one must include the pupil function:

$$h(\vec{r}) = \iint P(\vec{\rho}) \exp(i W(\vec{\rho})) \exp(i 2\pi \vec{r} \cdot \vec{\rho}) d^2 \vec{\rho}$$

where, $P(\vec{\rho})$ is the pupil transmission function; and
$W(\vec{\rho})$ is the pupil phase function, which contains both aberration and flare information.

Because of the possible higher spatial frequency in the wavefront function, $h(\vec{r})$ will have a larger spatial extent. In this case, the number of eigenvalues and eigenvectors required will be higher than the ideal system. Hence, the kernel support area is extended to take account of the contribution from a distance greater than λ/NA. However, the basic mathematical structure and algorithm remains the same.

Physical Model of Flare

Flare is generally described as the image component generated by high frequency phase "ripples" in the wavefront. Flare thus arises when light is forward scattered by appreciable angles due to phase irregularities in a lens. Such irregularities are often neglected for three reasons. First, the wavefront data is sometimes taken with a low-resolution interferometer, and moreover may be reconstructed using an algorithm of even lower resolution. Second, even when the power spectrum of the wavefront is known or inferred, it is not possible to include the effect of high frequency wavefront components on an image integral that is truncated at a short ROI distance, causing most of the scattered light to be neglected. Last, it is not straightforward to include these terms in the calculated image. The present invention addresses these problems.

Bearing in mind the problems and deficiencies of the prior art, it is therefore an object of the present invention to provide a method for calculating intermediate and long-range image contributions from mask polygons.

It is another object of the present invention to apply triangle convolution techniques to a sector-based OPC engine.

It is a further object of the present invention to provide a method to calculate incoherent flare.

It is yet another object of the present invention to reduce the time needed for numerical integration for intermediate range calculation.

Another object of the present invention is to provide an analytical solution for the triangle convolution on a power law incoherent kernel.

A further object of the present invention is to present a programmable method to divide long-range and intermediate-range calculations by truncating mask but not kernel.

Another object of the present invention is to provide a method to account for the image component generated by high frequency phase "ripples" in the wavefront.

It is yet another object of the present invention to provide a method to calculate the effects of phase irregularities in a lens.

Another object of the present invention is to provide a method that includes the effect of high frequency wavefront components on an image integral that is truncated at a short ROI distance.

Still other objects and advantages of the invention will in part be obvious and will in part be apparent from the specification.

SUMMARY OF THE INVENTION

The above and other objects, which will be apparent to those skilled in art, are achieved in the present invention, which is directed to in a first aspect, a method of performing model-based optical proximity correction comprising: calculating a finite integral for each sector of a mask polygon having defined corners to determine sector contributions from vertices of said mask polygon; integrating on a finite shape in said sector; summing up the contribution of said sectors of said mask polygon; and calculating interaction effects from said finite integral calculation. The finite shape may comprise at least two triangles. Each of said corners of said polygon is integrated. The method includes using a triangle convolution on unbounded sectors or a triangle convolution on a power-law incoherent kernel. The triangle convolution is reduced to an analytic expression that contains an incomplete beta function to facilitate numerical integration. A minimum radius, $R_{min}$, is determined such that said convolution does not double count any contribution from inside a ROI.

The method further includes providing a rule for a positive or negative sign of said contributions, comprising: assigning said sign of a first triangle to +1 for two partitions on a side of a first edge that are inside a sector and for said partition opposites, otherwise assigning said sign of said first triangle to −1; assigning said sign of a second triangle to said sign of said first triangle if said first and second triangle does not overlap, otherwise assigning said sign of said second triangle to the opposite of said sign of said first triangle. A hole is analytically defined in a flare kernel having said radius $R_{min}$ and any contributions from said flare that are within $R_{min}$ are treated with a partial coherent bilinear convolution. The radius $R_{min}$ is approximately equal to $\lambda/NA$. Calculating said interaction effects includes integrating over a coarse grid of a plurality of mask polygons.

In a second aspect, the present invention is directed to method of extending lithographic simulation integrals to include intermediate-range and long-range distance scales, said method comprising: dividing and decomposing at least two mask polygons into sectors made up of triangles having corners and edges; performing a distance scale calculation from corners of a plurality of said at least two mask polygons; implementing a polygon pinning algorithm; performing a triangle convolution of said plurality of mask polygons; combining contributions of said sectors to yield a convolution of said plurality of said mask polygons; combining said plurality of said mask polygons; and computing an aerial image for optical proximity correction from said combined sector contributions. The step of performing a distance scale calculation includes performing finite integrals from semi-infinite corners of said mask polygon. The method further comprises: calculating contributions from said each of said polygons at an image sample point; converting area convolution into a position vector dependent integral around a feature perimeter using first and second position vectors; assigning a resultant indefinite integral for said edges, such that a contribution from an edge between vertices of said first and second position vectors is a difference of indefinite integrals evaluated at each position vector; and parameterizing said resultant indefinite integral as function of an orientation of said edge, a perpendicular distance from said position vector to said edge, and a polar angle defined from said first position vector to said second position vector. A rule for a positive or negative sign of said contributions is also provided. The rule is adapted for said sectors including six basic sectors comprising 45-degree and 90-degree sectors. Values of said convolution are stored in a first look-up table for various values of said position vectors. The rule comprises: assigning said sign of a first triangle to +1 for two partitions on a side of a first edge that are inside a sector and for said partition opposites, otherwise assigning said sign of said first triangle to −1; assigning said sign of a second triangle to said sign of said first triangle if said first and second triangle does not overlap, otherwise assigning said sign of said second triangle to the opposite of said sign of said first triangle. The method further includes storing said signs of said triangle convolutions within a second look-up table, said second table having a row index and a column index, such that said row index is assigned for said first edge of said sector and said column index assigned for a second edge direction, uniquely specifying said sector type, said row and column indices determined for any sector in consideration, based on said first and second edge directions. First and second sign matrices, Mat1(edge1, edge2) and Mat2(edge1, edge2), are provided for said second look-up table, said matrices expressed as a function of said first and second edges, such that said first sign matrix, Mat1(edge1, edge2), determines which of said partitions where said direction vector may lie will have a positive sign for said first triangle, and said second matrix, Mat2(edge1, edge2), determines which of said partitions where said direction vector may lie gives the same sign for said second triangle compared to said first triangle. The row and column index of each matrix are given by eight basic partitions comprising: up, down, right, left, up-right, up-left, down-right, and down-left. The method further comprises multiplying said sign by −1 if said sector is convex, or by +1 if said sector is concave. The first matrix signifies which subsets of said partitions carry a positive sign or negative sign, such that if said partition matches a matrix entry, said sign of said first triangle convolution is assigned a positive value. The sign of the second triangle convolution is set equal to said sign of said first triangle partition within which said direction vector resided, else said sign is set opposite said first triangle convolution sign. A constant of integration is added in an indefinite integral for each edge, such that said constant of integration is independent of said polar angle, said constant of integration allowing for removal of any infinities in contributions from vertices in isolation. The constant of integration is present only in said indefinite integral, vanishing when a difference is taken of said indefinite integral at two endpoints of said edge. A contribution from an individual mask polygon that has a plurality of edges is represented by a summation over each edge of said mask polygon such that for each corner of said edge said constant of integration is subtracted from said indefinite integral. Singularities that arise from unbounded individual corners are resolved by adding constant of integration terms that leave corner contributions finite, such that each corner contribution is a summed flare from a pair of said triangles of said triangle convolution. The corner contribution comprises a calculation of a contribution from two of said triangles per vertex, such that said contributions from said triangle convolution gives a net contribution of said mask polygon after summation through all vertices.

In a third aspect, the present invention is directed to a program storage device readable by a machine, tangibly embodying a program of instructions executable by the machine to perform method steps for performing model-based optical proximity correction, said method steps comprising: calculating a finite integral for each sector of a mask polygon having defined corners to determine sector contributions from vertices of said mask polygon; integrating on a finite shape in said sector; summing up the contribution of said sectors of said mask polygon; and calculating interaction effects from said finite integral calculation.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
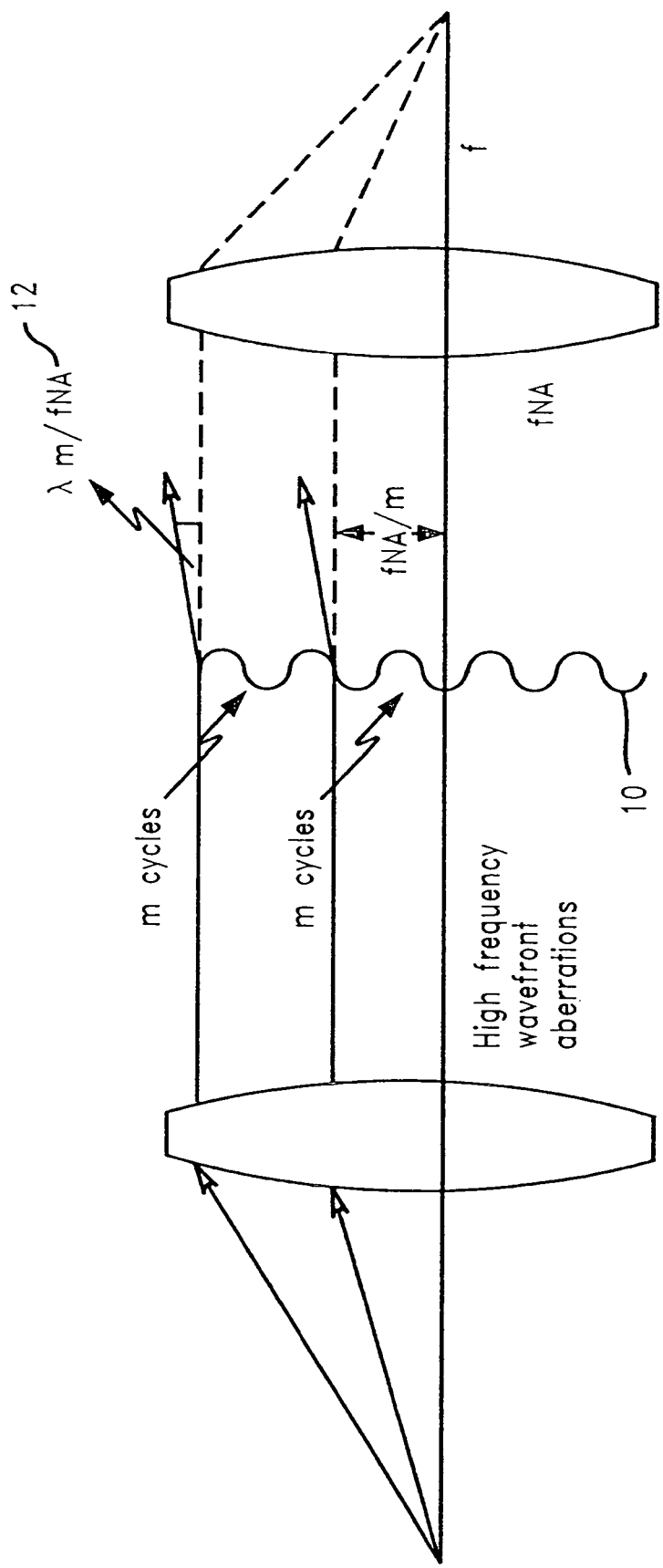
FIG. 1 depicts a schematic of the scattering of light due to a high frequency wavefront aberration.

In describing the preferred embodiment(s) of the present invention, reference will be made herein to FIGS. 1–12 of the drawings in which like numerals refer to like features of the invention.

This disclosure describes a new method for calculating long-range image contributions from mask polygons. The method works even with imaging kernels that are divergent over the unbounded sectors into which mask polygons are conventionally decomposed. It can therefore be used to calculate incoherent flare of the kind modeled by a power-law; the envelope of a fractal power spectrum. Alternatively, the integrated quantity can be a deterministic point spread function (PSF) calculated from a measured wavefront.

The method, however, is not limited to the integration of optical flare intensity. For example, image amplitude contributions may be calculated by convolving mask polygons with an eigenkernel from a bilinear integral, such as the Hopkin's Integral that governs partial coherent imaging. The kernel may also be non-optical in origin, and empirical in nature. It may represent a phenomenological linearization of chemical interactions between different printed features in a resist. It is demonstrated below that both optical and non-optical effects may be handled in the same formalism, so that the present invention may be effectively applied to either case.

Modifications to the Sum of Coherent Source (SOCS) method are proposed to incorporate a resist kernel, requiring only a sum of linear convolutions, or alternatively, incorporating an incoherent kernel.

SOCS with Resist Kernel

The resist image may be defined by convolution of $I_0(\vec{r})$ with a resist kernel K:

$$I(\vec{R}) = \int\int d\vec{r} I_0(\vec{r}) K(\vec{R}-\vec{r}) \quad (1)$$

$$= \int\int\int\int\int\int d\vec{r} d\vec{r}' d\vec{r}'' K(\vec{R}-\vec{r}) h(\vec{r}-\vec{r}')$$

$$h^*(\vec{r}-\vec{r}'') j(\vec{r}'-\vec{r}'') m(\vec{r}') m^*(\vec{r}'').$$

It can be shown that the above equation can be formulated as a SOCS decomposition, yielding:

$$I(\vec{R}) = \sum_j g_j |u_j(\vec{R})|^2, \quad (2)$$

where, $$u_j(\vec{R}) = \int\int d\vec{r}\, m(\vec{r}-\vec{R}) \psi_j(\vec{r}). \quad (3)$$

$g_j$ and $\psi_j(\vec{r})$ are the eigenvalues and eigenvectors obtained from:

$$g_j \psi_j(\vec{r}') = -\int\int d\vec{r}\, V(\vec{r},\vec{r}') j(\vec{r}-\vec{r}') \psi_j(\vec{r}), \quad (4)$$

where, $$V(\vec{r},\vec{r}') = \int\int d\vec{R}\, K(\vec{R}') h(\vec{r}-\vec{R}') h^*(\vec{r}'-\vec{R}'). \quad (5)$$

This means that with the resist kernel, the final image intensity can be treated similarly to the SOCS method, which requires only a sum of linear convolutions.

SOCS Plus Incoherent Kernel

By defining $$\vec{r}_{Avg} = \frac{\vec{r}'+\vec{r}''}{2}, \vec{\Delta} = \vec{r}''-\vec{r}', \quad (6)$$

$$\vec{r} = \vec{r}-\vec{r}_{Avg},$$

and using the approximation $$h\left(\vec{r}-\frac{\vec{\Delta}}{2}\right) h^*\left(\vec{r}+\frac{\vec{\Delta}}{2}\right) \cong |h(\vec{r})|^2 \text{ at large values of } \vec{r} = \vec{r}-\vec{r}_{Avg}, \quad (7)$$

the Hopkin's Integral becomes:

$$I(\vec{r}) \cong \sum_{i=1}^{N} \left| \int_{ROI} d^2\vec{r}_{Avg} \tilde{h}_i(\vec{r}-\vec{r}_{Avg}) m(\vec{r}_{Avg}) \right|^2 + \quad (8)$$

$$\int\int_{\substack{outside \\ ROI}} d^2\vec{r}_{Avg} |h(\vec{r}-\vec{r}_{Avg})|^2$$

-continued $$\left[ \int\int_{\substack{outside \\ ROI}} d^2\vec{\Delta} j(\vec{\Delta}) m\left(\vec{r}_{Avg}-\frac{\vec{\Delta}}{2}\right) m^*\left(\vec{r}_{Avg}+\frac{\vec{\Delta}}{2}\right) \right]$$

where, $\tilde{h}_i$ is the component coherent kernel.

This approximation has a simple interpretation. The image contribution from mask polygons within the ROI is accounted for using the usual formulation for partial coherent imaging (in the SOCS expansion), whereas contributions from polygons outside the ROI are accounted for in a more approximate way. The contribution from every mask point is thus accounted for with different degrees of approximation without double counting. Though the integration method changes abruptly at the ROI boundary, it is an improvement over the present practice in which contributions from outside the ROI are dropped to zero.

The second integral is not truly an incoherent integral, since the mask-like term in square brackets depends on the coherence $j(\vec{\Delta})$. An incoherent case corresponds to delta-function coherence, which ultimately is not a good approximation when the mask consists of low-k lines. In lithography, the total source energy is usually normalized to 1, which means that with finite coherence and a chrome mask the quantity in square brackets will always be less than the pure incoherent case. When the incoherent assumption is sufficiently accurate, the second integral is a linear convolution, which is well suited for the method of the present invention.

The present invention is described in three distinct parts. First, an algorithm is introduced that applies to Optical Proximity Correction in optical lithography. A finite integral for each sector of polygon replaces an infinite integral used in the prior art that otherwise diverges for specific user-defined OPC kernels. Integrating over two triangles, rather than integrating on the full sector, achieves a finite integral. Even if the kernel is extremely long range, the integral still will not diverge because the finite area is integrated. Second, an analytical approach is presented for a power law kernel that reduces the numerical integration of a sector to an analytical expression evaluation, which greatly enhances computation speed. Third, a methodology is introduced to divide the mask into regions to calculate interaction effects, such as intermediate-range and long-range effects, by truncating the mask instead of truncating the kernel function as suggested in prior art. This division efficiently facilitates the calculation of long-range and intermediate-range proximity effect calculations and tailors well to an OPC environment application.

Different Scales of Wavefront Spatial Frequencies

FIG. 1 depicts a schematic of the scattering of light from a high frequency wavefront aberration. High frequency wavefront aberrations 10 are depicted for m cycles of wavelength λ, such that the scattering 12 is a function of the wavelength, the number of cycles, the frequency, and the numerical aperture. A harmonic component of phase modulation in the pupil that has periodicity m cycles across the numerical aperture (pupil radius) will deviate light by a scattering distance mλ/NA in the image plane. Thus, if the radius of the optical kernel is set at 0.5 μm, the neglected intensity will include mid-range spatial frequencies as well as long-range flare. Indeed, the contributions from all phase frequencies much beyond the first thirty-seven Zernike terms will be neglected.

These neglected frequencies are relevant to diagnostic measurements that concern the impact of large pads on the widths of nearby fine lines, generally at separation distances of approximately 1 $\mu$m or more. Furthermore, it may be desirable to improve the accuracy of the primary partial coherent image calculation by modestly extending the range of integration. Considering slightly larger scales, it is generally advantageous to model the kind of printing differences that are observed when fill patterns are placed around test structures at distances beyond approximately 2 $\mu$m. At the other extreme, non-negligible flare contributions are known to arise over a range of many millimeters.

Generally, power-law exponents of small absolute value characterize data across long scales, while terms with larger exponents contribute across shorter ranges. Lithography lenses provide large Strehl ratios where very low frequencies (aberrations) are concerned. This implies that only small amounts of light can be deviated by features which are within approximately $\lambda$/NA of the image point of interest. Thus, one would not expect to see significant flare levels that are governed by power law exponents which approach three, because appreciable flare intensities can only accumulate over distances that are large compared with $\lambda$/NA. In general, power law exponents on the order of 2.5 govern incoherent flare. Short-range wavefront ripple, beyond the standard thirty-seven Zernike terms, may still be important since it affects the coherent or partially coherent interaction between nearby features, particularly when the source provides a narrowly structured coherence, such as a low sigma, aggressive annular quadrupole. It is useful to adopt empirical kernels that take into account other medium-range interaction effects, which may be non-optical in nature, such as resist loading effects.

Typically, it is more efficient to integrate contributions over very long ranges using a grid that is much coarser than typical mask polygons. This permits an efficiency improvement because it is possible to carry out convolutions with a pattern that is locally averaged on a periodic grid (density-map) for many image points at once. Fast Fourier Transforms (FFTs) are the conventional method for doing fast bitmap convolutions. Direct integration with mask polygons is appropriately carried out in an intermediate-range.

Non-Flare Effect

Important non-flare effects arise from resist processing. The origin of the resist effect may be from photoacid/base diffusion, developer loading effect, or airborne contamination. The resist effect is usually modeled by a full resist chemical model or a lumped parameter model. As an approximation, the resist effect may also be described by an incoherent convolution of the image intensity with a resist kernel, experimentally calibrated. One can perform a linear convolution of the resist kernel on the calculated image intensity, or absorb the resist kernel in the bilinear transform and do a sum of coherence source (SOCS) decomposition and perform convolution between the mask function and coherent eigenkernels as mentioned above.

Figure 2:
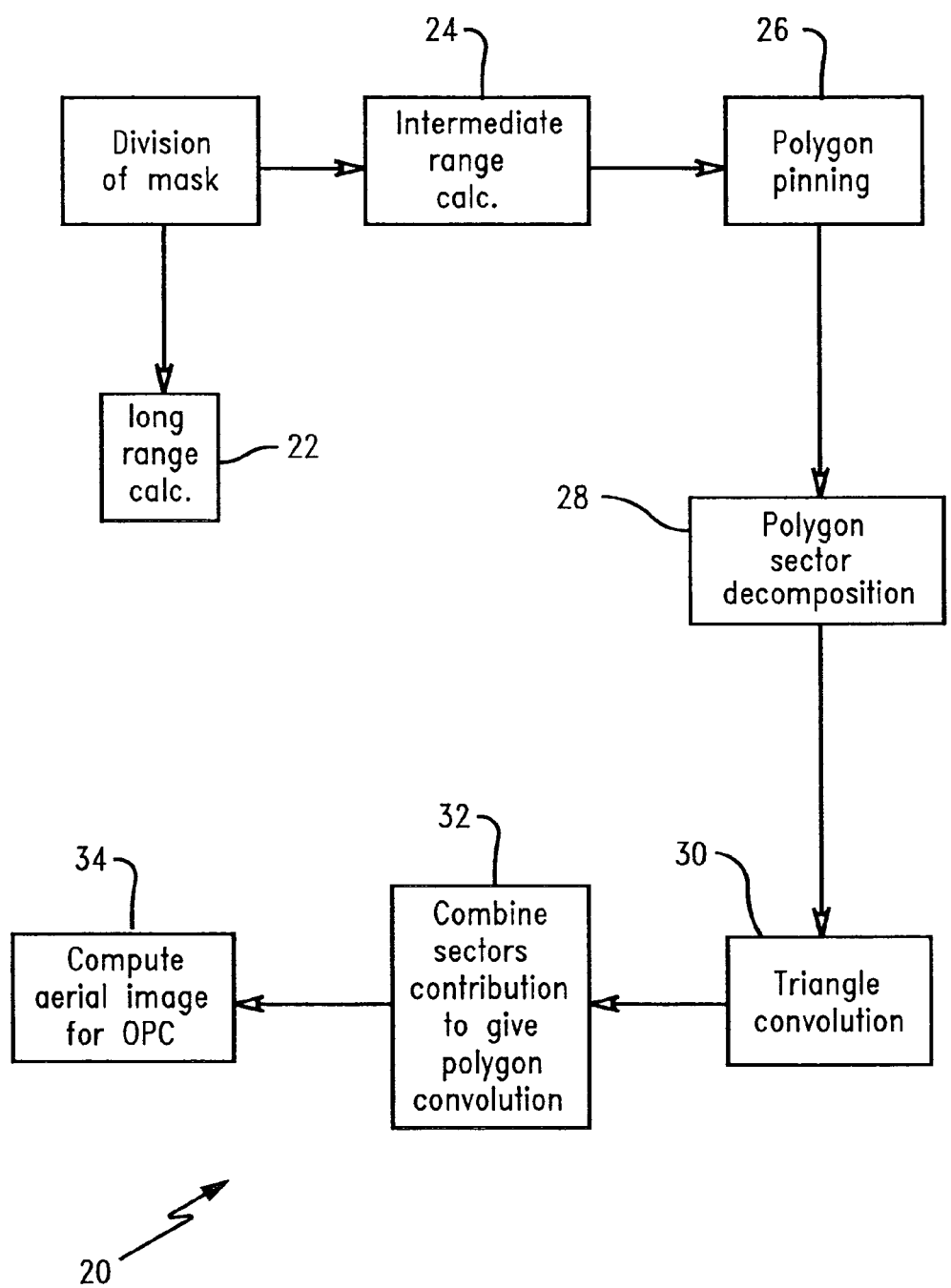
FIG. 2 depicts a flowchart of the proposed algorithm of the present invention for extending the range of lithographic simulation integrals to include intermediate and long-range distance scales.

FIG. 2 depicts a flowchart of the proposed algorithm 20 of the present invention for extending the range of lithographic simulation integrals to include intermediate and long-range distance scales. The mask is divided for long-range calculations 22 and intermediate range calculations 24. Polygon pinning 26 is performed under the intermediate-range calculation, decomposing the polygon sectors 28, and performing triangle convolution 30. A description of a polygon pinning algorithm is defined and taught in a related, cross-referenced application, identified above, and incorporated herein by reference. Sector contributions are then combined 32, and the aerial image is computed for optical proximity correction 34.

Finite Integrals from Semi-Infinite Corners

A key component of the present invention is to obtain finite integrals from semi-infinite corners. Sector contributions from the vertices of mask polygons are regularized, with the polygon convolved with a kernel that is divergent over the sector, such as a power-law kernel $r^{-\gamma}$, with $\gamma \leq 2$. It is known in the lithography art that mask polygons may be represented as a superposition of open sectors having essentially semi-infinite corners, but that these sectors are unbounded in some directions, potentially leading to infinite contributions.

Of course, the individual sectors are only a means to an end, namely finding the convolution over a finite polygon. Thus, one solution is to bound all sectors at a distant perimeter, for example, 301 mm for wafers of the current state of the art. However, this technique impacts accuracy.

A preferred solution is based on the following considerations. Given an observation point $\vec{x}_0$ at which to calculate the contribution from a polygon, a Stoke's or Green's theorem is employed to covert the area convolution into an $\vec{x}_0$-dependent integral around the feature perimeter, which is then the sum of integrals along each edge.

Assigning the resulting indefinite integral for some edge as Q, the contribution from the particular edge between vertices $\vec{x}$ hd n and $\vec{x}_{n+1}$ is then $Q_{n+1} - Q_n$. The term $Q_{n+1}$ may be parameterized in terms of three quantities, namely: $\psi(\vec{x}_{n+1} - \vec{x}_n)$, which is the orientation of the edge; $h(\vec{x}_0, \vec{x}_n, \vec{x}_{n+1})$, which is the perpendicular distance from $\vec{x}_0$ to the edge; and $\theta(\vec{x}_0, \vec{x}_n, \vec{x}_{n+1}; \vec{x}_{n+1})$, which is the polar angle from $\vec{x}_0$ to $\vec{x}_{n+1}$, with the perpendicular defining the $\theta=0$ origin. These quantities are illustrated below. Note that $\theta$ is the only argument of Q that is dependent on the specific location of the individual endpoints along the edge.

One may also include a constant of integration $\tilde{Q}$ in the indefinite integral for each edge, provided $\tilde{Q}$ is independent of $\theta$. The constant of integration is only present in the indefinite integral, vanishing when the difference is taken of the values of the indefinite integral at the two endpoints of the edge. Even so, this constant of integration allows for removal of any infinities in the contribution from vertices in isolation.

Adding a constant of integration to the contribution from each edge, the integral over the polygon is expressed as a sum over edges:

$$F = \sum_{n \text{ edges}} \{[Q(\psi_{n+1,n}, h_{n+1,n}, \theta_{n,n+1;n+1}) - \tilde{Q}(\psi_{n+1,n}, h_{n+1,n})] - [Q(\psi_{n+1,n}, h_{n+1,n}, \theta_{n,n+1;n}) - \tilde{Q}(\psi_{n+1,n}, h_{n+1,n})]\}. \quad (9)$$

Here, F represents the contribution from an individual mask polygon, for example from flare, that has n edges, with each of the bracketed terms in Eq. (9) representing the contribution from one endpoint of the edge. F can be rearranged into a sum over the vertices by regrouping the terms. In this way, a sum over unbounded sectors is achieved, as follows:

$$F = \sum_{n \text{ corners}} \{[Q(\psi_{n,n-1}, h_{n,n-1}, \theta_{n-1,n;n}) - \tilde{Q}(\psi_{n,n-1}, h_{n,n-1})] - \qquad(10)$$
$$[Q(\psi_{n+1,n}, h_{n+1,n}, \theta_{n,n+1;n}) - \tilde{Q}(\psi_{n+1,n}, h_{n+1,n})]\}.$$

Note that even though the constant of integration no longer cancels within each term in this new summation form (sum over corners), it still cancels over the polygon as a whole. In fact any integration constant may be employed as long as it obeys the above functional dependence. This is key to resolving the singularity that arises from unbounded individual corners. Even though $Q_{n,n-1} - Q_{n+1,n}$ may be infinite, the sum can be transformed by adding $\tilde{Q}$ terms that leave each corner contribution finite, without changing the total.

Figure 3:
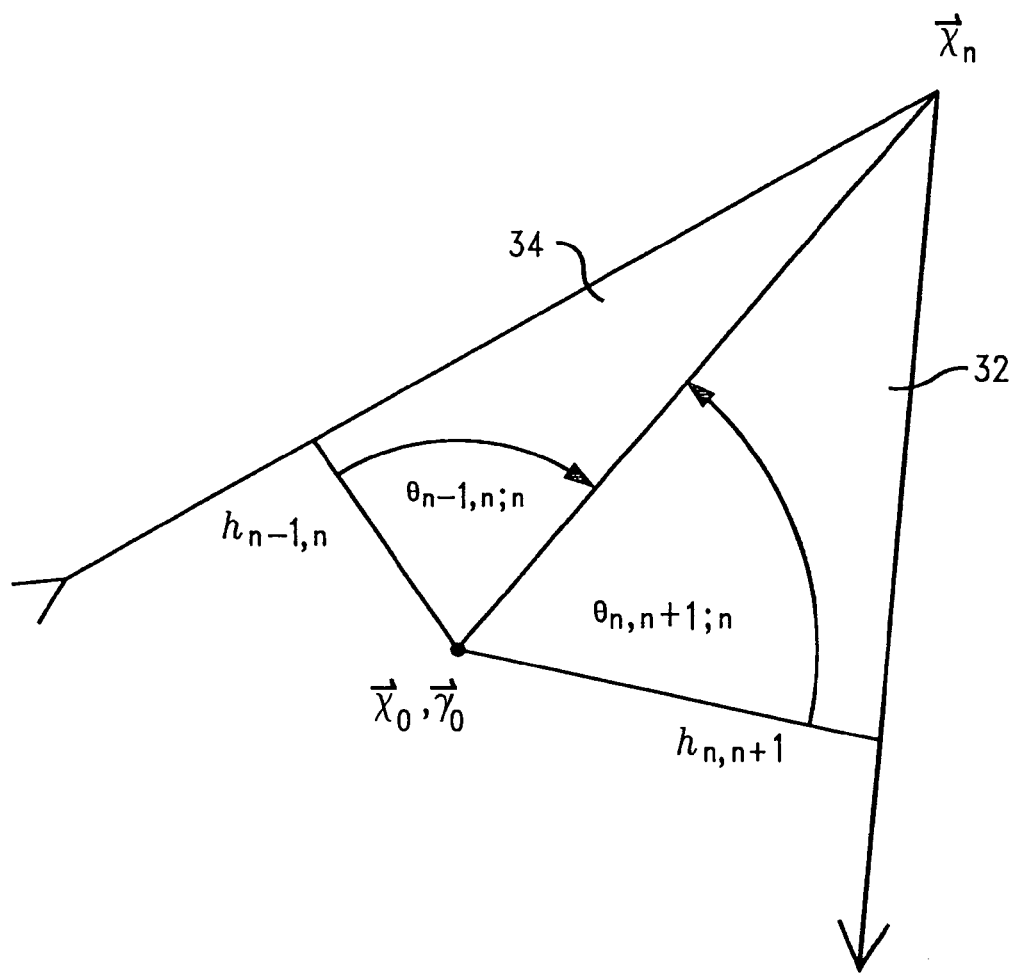
FIG. 3 depicts the geometry for calculating each corner contribution for the summed flare value from a pair of triangles.

The easiest way to accomplish this is to make each corner contribution the summed flare from a pair of triangles. The basis for this strategy is the fact that there is one value of $\theta$ that will always be independent of the endpoints, namely $\theta=0$, since $\theta=0$ is unambiguously defined by the perpendicular from the edge to the point of interest. One may then choose $\vec{\tilde{Q}}(\psi_{n,n-1}, h_{n,n-1}) \equiv Q(\psi_{n,n-1}, h_{n,n-1}, 0)$, and with this choice, the square-bracketed terms are no longer unbounded. FIG. 3 depicts the geometry for calculating each corner contribution for the summed flare value from a pair of triangles 32, 34.

Figure 4:
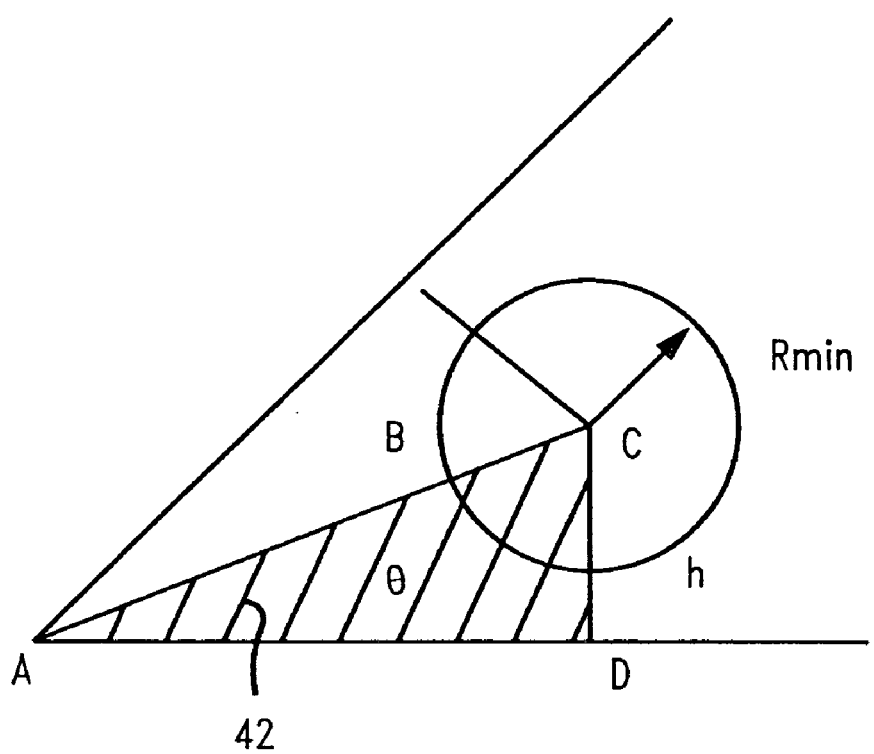
FIG. 4 illustrates the geometry for the derivation of the triangle convolution under the condition $h \geq R_{min}$.

The derivation of the triangle convolution is identified below. Referring to FIG. 4, and $$\text{assuming the kernel} \begin{matrix} = G(r, \theta), \text{ if } r \geq R_{min} \\ = 0, \text{ if } r < R_{min} \end{matrix} \qquad(11)$$

let L be defined as the integral for triangle ACDA depicted as the crosshatched area 42, with h and $\theta$ as shown. For the case of $h \geq R_{min}$ (case 1):

$$L = \int_0^\theta \int_{R_{min}}^{r(\theta)} G(r, \theta) r \, dr \, d\theta \qquad(12)$$

where $$\cos\theta = \frac{h}{r(\theta)} \qquad(13)$$

Figure 5:
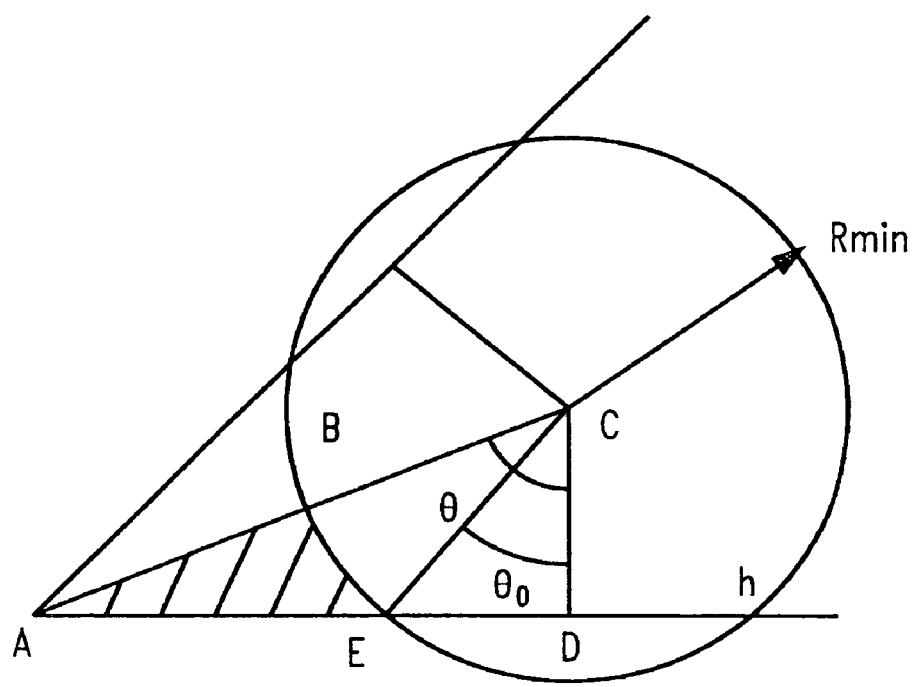
FIG. 5 illustrates the geometry for the derivation of the triangle convolution under the condition $h < R_{min}$.

For the case of $h < R_{min}$, (case 2) as shown in FIG. 5, the triangle integral is given by L'(h,$\theta$)=Triangle ACDA−Triangle CDEC.

$$L'(h, \theta) = \int_{\theta_0}^\theta \int_{R_{min}}^{r(\theta)} G(r, \theta) r \, dr \, d\theta \qquad(14)$$
$$= L(h, \theta) - L(h, \theta_0)$$

where $$\cos\theta_0 = \frac{h}{R_{min}} \qquad(15)$$

For the case where $$\frac{h}{\cos\theta} < R\text{min},$$

Figure 6:
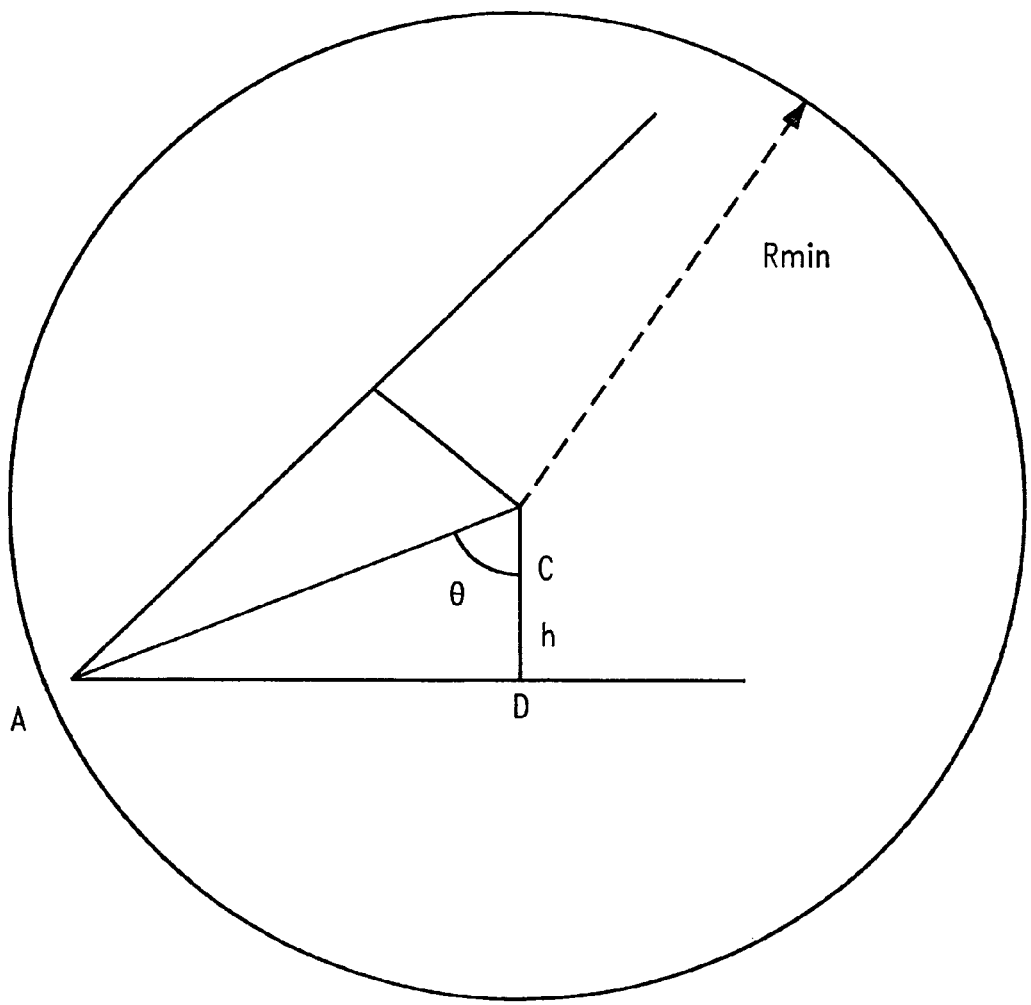
FIG. 6 illustrates the geometry for the derivation of the triangle convolution under the condition $h/\cos \theta < R_{min}$.

(case 3) as shown in FIG. 6, the triangle integral is given by L"(h,$\theta$)=0, since the whole triangle is inside the hole of the kernel.

Rules for Sector Convolution

Figure 7:
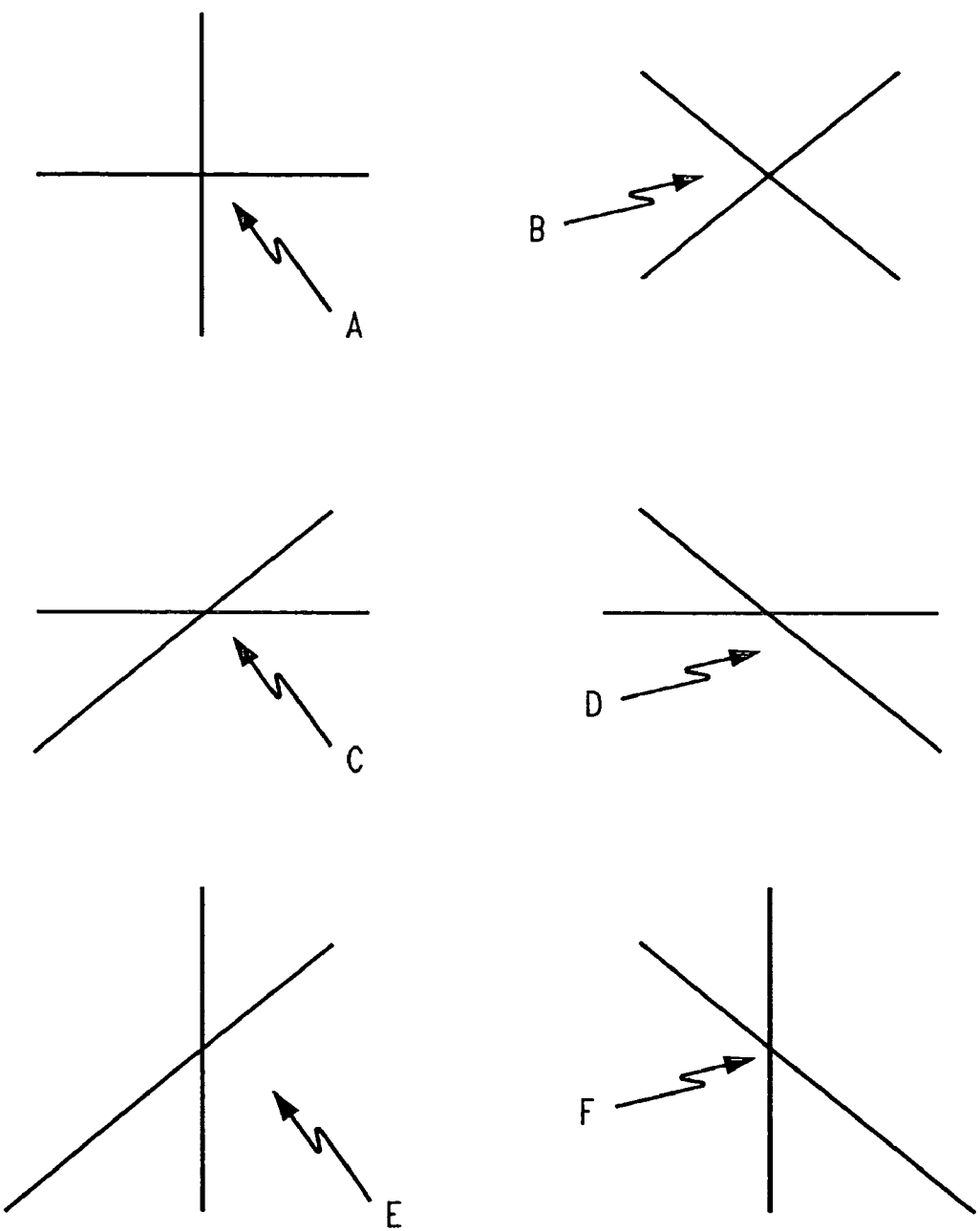
FIG. 7 is a schematic of the twenty-four different sectors depicted in six basic groups for sector convolution.

The polygon convolution method involves the calculation of the contribution from two triangles per vertex as previously mentioned and illustrated in FIG. 3. The triangle contributions give the net of the contribution of the polygon after summation through all vertices. Since the polygon can be of arbitrary shape and the observation point $x_o$ can be inside or outside the polygon, a rule for the sign of the contribution of each triangle is required. In most cases, lithographic mask patterns contain polygons formed by horizontal, vertical, and 45-degree line segments only. Therefore, an algorithm must handle 45-degree sectors in addition to 90-degree sectors. This makes for 96 possible types of sectors that may exist in any polygon. By taking into account the symmetry between the clockwise and counter-clockwise vertex transversal direction and the anti-symmetry between convex and concave sectors, the unique number of sector reduces to twenty-four. The sector is convex when the inside angle of the vertex is less than or equal to 180 degrees; otherwise, the sector is concave. Moreover, further study shows that the sector convolution is identical in magnitude among four other specific sectors. The twenty-four different sectors are depicted in six basic groups A–F, as shown in FIG. 7.

Figure 8A:
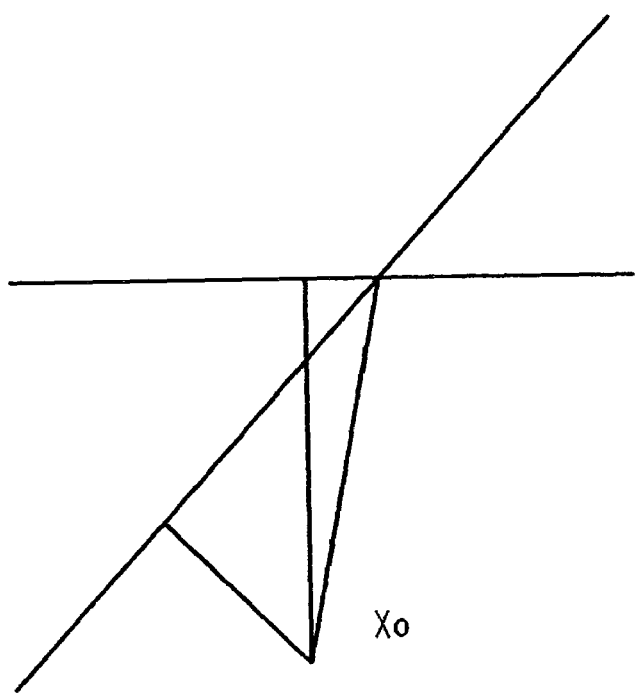
FIG. 8A depicts two overlapping triangles having opposite signs for use in sector convolution.
Figure 8B:
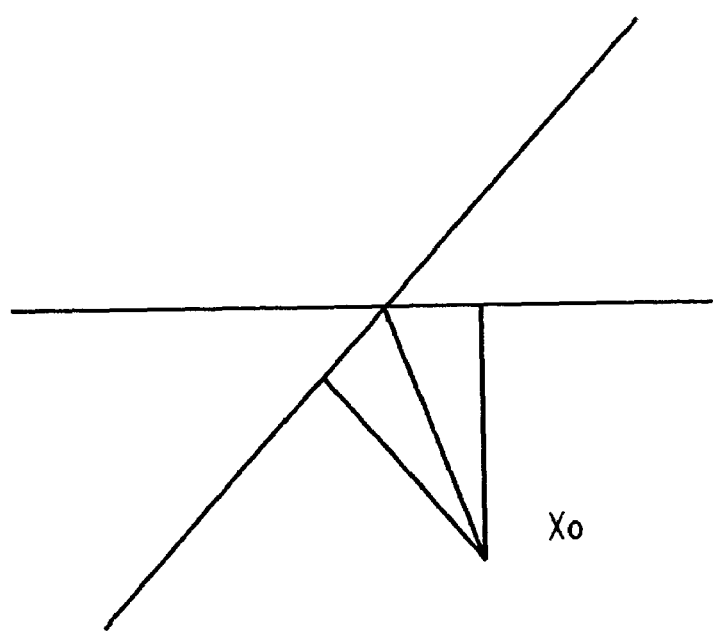
FIG. 8B depicts two non-overlapping triangles having the same sign for use in sector convolution.

The numerical value of the convolution, which is always non-negative, is identical for the sectors within each group since the triangles created are identical, reducing the number of unique sectors to the six basic sectors. Once the sector convolution has been evaluated for these six basic sectors, it can then be stored in look up tables for various $x_o$. Note that any one of the sectors in each group can become a basic sector as along as a corresponding rule for the sign convention is built. The sign, $\Psi$, of these triangle convolutions can be depicted within a lookup table also. For 45-degree sectors, extra complexity arises for the sign convention of a triangle of the pair. FIG. 8 shows two different scenarios for the sign assignment. The signs of the two triangles can be the same or opposite, depending on whether the two triangles overlap as shown in FIG. 8A, or remain adjacent but not overlapping, as shown in FIG. 8B, which in turn depends on where $x_o$ is located with respect to the sector. By generalizing this extra condition, a set of sign assignment tables can be built to determine the sign of the two triangles.

General Rule for Sign Determination

Figure 9A:
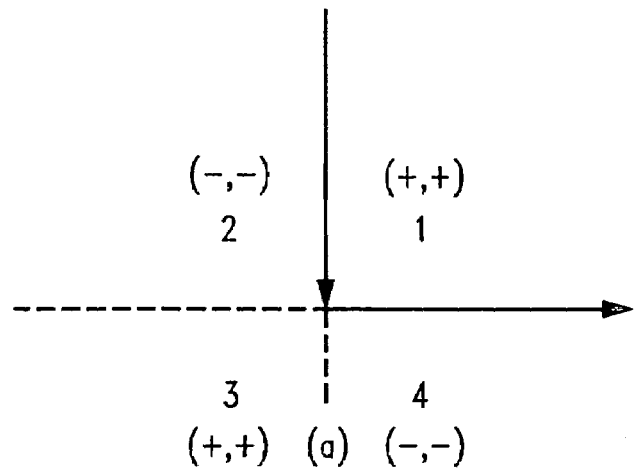
FIG. 9A depicts an example of sign generation for an orthogonal (90 degree) vertex.
Figure 9B:
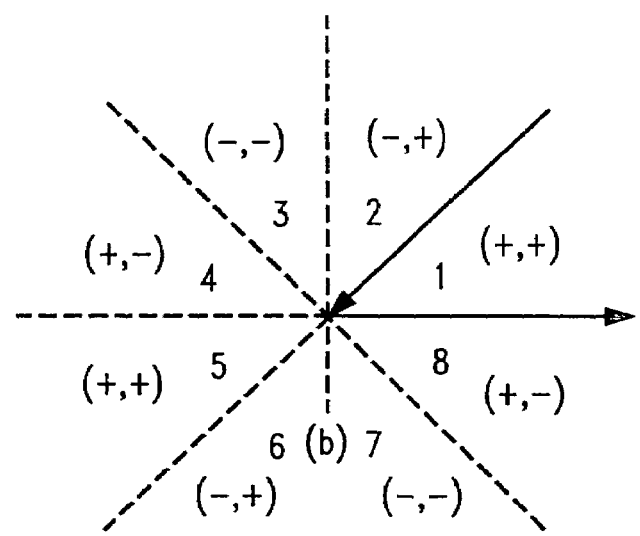
FIG. 9B depicts and example of sign generation for a 45 degree vertex.

Referring to FIGS. 9A and 9B, the general rule for sign determination for both 90 degree and 45 degree sectors is ascertained as follows. If $\Psi 1$ is assigned to the sign of the first triangle, and $\Psi 2$ assigned to the sign of the second triangle, the rule for $\Psi 1$ is simply stated as $\Psi 1=+1$ for the two partitions on the side of Edge #1 that are inside the sector, as well their opposites. Otherwise $\Psi 1$ is assigned to −1. If the sector is concave, $\Psi 1$ is multiplied by −1, otherwise there is no change as it is multiplied by +1. A sector is concave if its inside angle is greater than 180 degrees, or else it is convex. The rule for $\Psi 2$ is simply $\Psi 2 = \Psi 1$ if the two triangles do not overlap; otherwise $\Psi 2 = -\Psi 1$.

The sign determination process is determined in the following manner. First, two sign matrices for table lookup are generated. The row and column index of each matrix are given by eight basic directions: up, down, right, left, up-right, up-left, down-right, and down-left. The row index is assigned for a $1^{st}$-edge direction of the sector and the column index assigned for a $2^{nd}$-edge direction. The row and column indices uniquely specify the sector type. The signs for the triangle convolution are stored in the matrix when $x_o$ is in each of the eight partitions in real space. The first sign matrix elements, generally referred to as Mat1(edge1, edge2), determine which of the eight partitions that $x_o$ may lie will have a positive sign for the first triangle. The second matrix, generally referred to as Mat2(edge1, edge2), determines which of the eight partitions where $x_o$ may lie gives the same sign for the second triangle compared to the first.

Next, the row and column indices are determined for any sector in consideration, based on the direction of the first and second edge of the sector. The first matrix signifies which subsets of the eight partitions carry a positive sign or negative sign. The partition that $x_o$ resides in is determined for a particular $x_o$. If this partition number matches the matrix entry, then the sign of the first triangle convolution will be positive.

If the sector is convex (or concave), the resultant sign is multiplied by −1 (or +1) according to the convention used.

The same row and column indices are then used in the second sign matrix, Mat2. If the partition within which $x_o$ resided matches the second matrix entry, the sign of the second triangle convolution is same as first triangle, otherwise it is the opposite sign.

Figure 10:
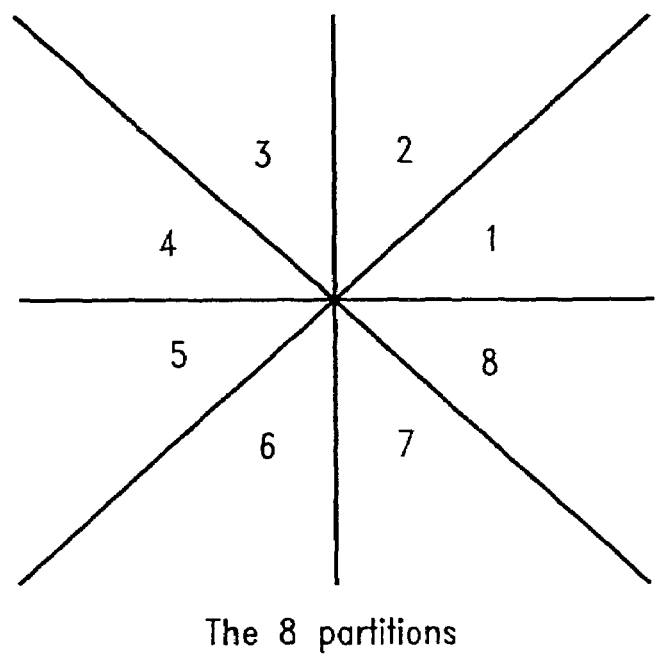
FIG. 10A graphically illustrates the eight partitions of a mask space for feature edges of 90 and 45 degree orientation.
FIG. 10B graphically illustrates a sector defined by two edges following the edge convention of the present invention.
Figure 10:
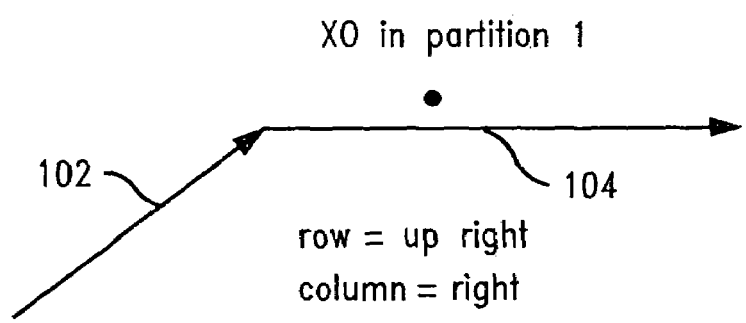

FIG. 10 graphically illustrates the procedure to find the sign of an individual triangle convolution. FIG. 10A shows the eight partitions 1–8 of the mask space for feature edges of 90 and 45 degree orientation. FIG. 10B shows as an example a sector defined by two edges. The row index is in the up-right direction 102, and the column index in the right direction 104. In this example, the aforementioned procedural steps require that regions 2, 3, 6, and 7 have a positive sign, and the remaining regions negative. Since $x_o$ is in region 1 in this example, it is assigned a negative sign. However, if this sector were concave, the sign would be opposite. The sign remains unchanged when the sector is convex. According to the second sign table, region 1 corresponds to a positive sign, thus the sign of the second triangle will be the same as the first.

Polygon Convolution Using Power Law Kernel

As mentioned above, the flare effect may be treated as an incoherent kernel as long as one is considering contributions outside the coherence distance, $R_{min}$, of the point spread function. The incoherent kernel for the flare calculation generally obeys a power law of the form G(r):

$$G(r) = \frac{K}{r^\gamma} \text{ when } r \geq R_{min} \tag{16}$$
$$= 0 \text{ when } r < R_{min}$$

where $r=\sqrt{x^2+y^2}$. (17)

Evaluation of the convolution at an observation point $\vec{x}_0$ for a general kernel usually requires numerical integration. However, for a power law kernel, the triangle convolution $Q(\Psi_{n,n-1}, h_{n,n-1}, \vartheta_{n,n-1})$ can, after some algebraic manipulation, be reduced to an analytic expression that contains the incomplete beta function, denoted $I_x(a,b)$. Beta is a constant evaluated from a beta function. The triangle convolution is represented, for case 1, 2, and 3 mentioned in the previous section above, as $$Q(\Psi,h,\theta) = \Psi L_i(h,\theta), i=1, 2, 3 \tag{18}$$

In case 1, $$L_1 = \int_0^\theta \int_{R_{min}}^{r(\theta)} \frac{1}{r^\gamma} r\, dr\, d\theta \tag{19}$$
$$= \int_0^\theta \frac{d\theta}{2-\gamma} \int_{R_{min}}^{r(\theta)} r^{1-\gamma} dr$$
$$= \int_0^\theta \frac{d\theta}{2-\gamma} [r(\theta)^{2-\gamma} - R_{min}^{2-\gamma}]$$

where $$\cos\theta = \frac{h}{r(\theta)} \tag{20}$$

so, $$L_1 = \int_0^\theta \frac{d\theta}{2-\gamma} \left[ \frac{\cos^{\gamma-2}\theta}{h^{\gamma-2}} - R_{min}^{2-\gamma} \right] \tag{21}$$
$$= \left[ \frac{h^{2-\gamma}}{(2-\gamma)} \int_0^\theta \cos^{\gamma-2}\theta d\theta \right] - \frac{\theta}{2-\gamma} R_{min}^{2-r}$$
$$= \left[ 2\theta R_{min}^{2-\gamma} - h^{2-\gamma} \text{Beta}\left(\frac{\gamma-1}{2}, \frac{1}{2}\right) I_{\sin^2\theta}\left(\frac{1}{2}, \frac{\gamma-1}{2}\right) \right] \bigg/ 2(\gamma-2)$$

In case 2, $$L_2(h, \theta) = \int_{\theta_0}^\theta \int_{R_{min}}^{r(\theta)} \frac{1}{r^\gamma} r\, dr\, d\theta \tag{22}$$
$$= L_1(h, \theta) - L_1(h, \theta_0)$$
$$= \left\{ 2(\theta-\theta_0) R_{min}^{2-\gamma} - h^{2-\gamma} \text{Beta}\left(\frac{\gamma-1}{2}, \frac{1}{2}\right) \right.$$
$$\left. \left[ I_{\sin^2\theta}\left(\frac{1}{2}, \frac{\gamma-1}{2}\right) - I_{\sin^2\theta_0}\left(\frac{1}{2}, \frac{\gamma-1}{2}\right) \right] \right\} \bigg/ 2(\gamma-2)$$

In case 3, $$L_3(\Psi,h,\theta)=0 \tag{23}$$

The above expressions are only valid for $\gamma \neq 2$. For $\gamma=2$, the function $L_1$ reduces to the following, $$L_1(h,\theta)=\Psi[\theta \ln(2h/R_{min})-\tfrac{1}{2}f(\pi-2\theta)] \tag{24}$$

where f(x) is the Clausen Integral.

The incomplete Beta function and the Clausen Integral may be predetermined for a specific $\gamma$ value, and stored for table lookup during any subsequent calculation of Q. The analytical expression for Q speeds up the convolution calculation significantly with the look up table, avoiding timeconsuming numerical integration. The incomplete Beta function is derived from the following expression:

$$J = \int_0^\theta \cos^{\gamma-2}\phi \, d\phi$$

Let $= \cos^2\phi$, $dt = -2\cos\phi\sin\phi d\phi$ (25)

$$J = \int_0^{\cos^2\theta} \frac{t^{(\gamma-2)/2}}{-2(1-t)^{1/2}t^{1/2}} dt$$

$$J = \frac{1}{2}\text{Beta}\left(\frac{\gamma-1}{2}, \frac{1}{2}\right)\left[I_{\cos^2\theta}\left(\frac{\gamma-1}{2}, \frac{1}{2}\right) - I_1\left(\frac{\gamma-1}{2}, \frac{1}{2}\right)\right]$$ (26)

where Beta is the Beta function $$\text{Beta}(z, w) = \int_0^1 t^{z-1}(1-t)^{w-1} dt \text{ and}$$ (27)

$I_x$ is the incomplete Beta function with argument x:

$$I_x(z, w) = \int_0^x t^{z-1}(1-t)^{w-1} dt$$ (28)

Using the identity:

$$I_x(a,b) = 1 - I_{1-x}(b,a)$$

$$I_1(a,b) = 1$$ (29)

and equation (26), yields:

$$J = \frac{1}{2}\text{Beta}\left(\frac{\gamma-1}{2}, \frac{1}{2}\right)\left[-I_{\sin^2\theta}\left(\frac{\gamma-1}{2}, \frac{1}{2}\right)\right]$$ (30)

Effect of $R_{min}$ $R_{min}$ is determined such that the polygon convolution does not double count the contribution from inside the ROI, which essentially corresponds to the diffraction-limited PSF and the first 37 Zernike terms of aberration. For this reason a "hole" is placed in the flare kernel having a radius $R_{min}$. $R_{min}$ is approximately given by $\lambda/NA$. All flare contributions from within $R_{min}$ are treated with partial coherent bilinear convolution, which is calculated within the ROI.

Division of Incoherent Flare Calculation into Long and Intermediate-Ranges

For long-range effects, such as the case when the power law kernel is infinite in extent ($\gamma \leq 2$), the sector convolution must be applied on the full chip. However, it is impractical and not necessary to do sector convolution on all polygons on the mask. For efficiency reasons, the full mask pattern M is divided into two domains. Note that, unlike the subdivision of the point spread function between aberration effect and flare, the flare kernel is not divided into long-range and intermediate-range; instead the mask is partitioned. First, as depicted in FIG. 11A, the long-range convolution on M1 is done via a Fast Fourier Transform on a coarse grid 110, with each grid point 112 representing an average pattern density of patterns inside that particular grid point. This step must be done once per mask, since the pattern density in each grid point is assumed not to change significantly even after an optical proximity correction. Second, the near range convolution is done via polygon convolution inside domain M2, as shown in FIG. 11B. Of course, the domain M3, which is of the same size of M2, needs to be subtracted in order not to double count the contribution. Linearity and additivity are exploited in the convolution operator as shown below. Here the mask intensity function and the kernel are defined as:

$$M(\bar{r}) = |m(\bar{r})|^2;$$ (31)

$$\text{Kernel}(\bar{r}) = |h(\bar{r})|; \text{ and,}$$

$$\text{Flare} = \text{Kernel} \otimes M$$
$$= \text{Kernel} \otimes (M1 - M3 + M2)$$
$$= \text{Kernel} \otimes M1 - \text{Kernel} \otimes M3 + \text{Kernel} \otimes M2$$

where, $\otimes$ represents a convolution operation.

M2 is the domain defined by a predetermined distance $+/-R_{mid}$ in the x and y directions. M1 defines the rest of the mask. In order not to double count the polygon contribution in M1 and M2, polygons that lie in both domains need to be clipped at the domain boundary. M3 represents the hole that is trimmed out by M2 and can be calculated easily. A polygon pinning algorithm is then applied.

Figure 11:
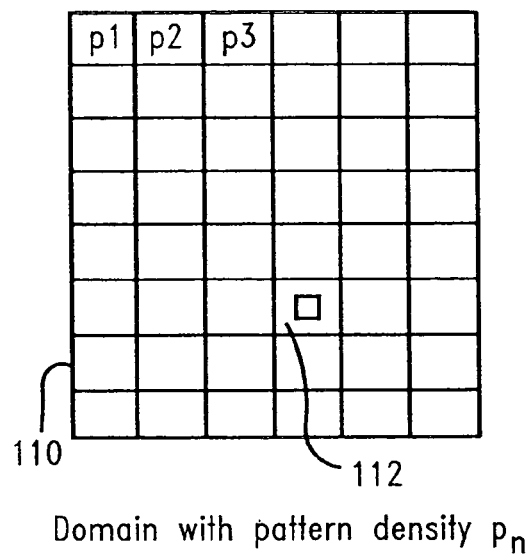
FIG. 11A illustrates the long-range convolution performed on a coarse grid, with each grid point representing an average pattern density of patterns inside that particular grid point.
FIG. 11B depicts the near range convolution performed via polygon convolution inside a domain.
Figure 11B:
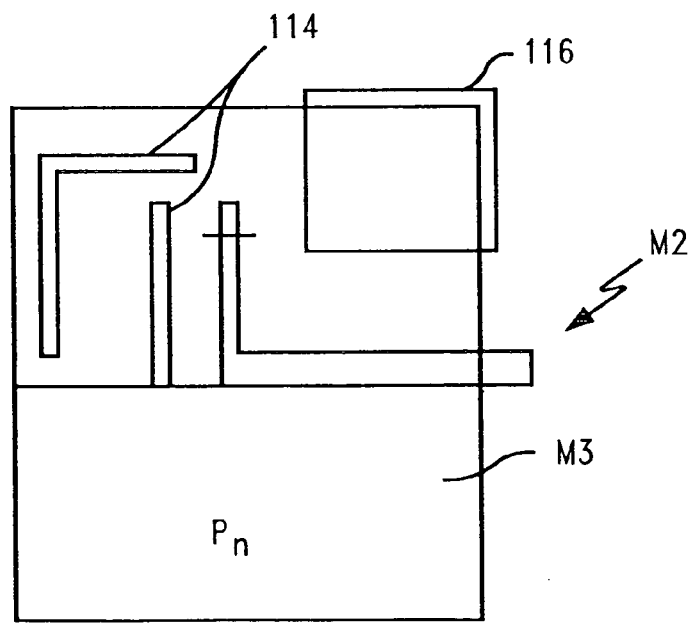
Figure 12A:
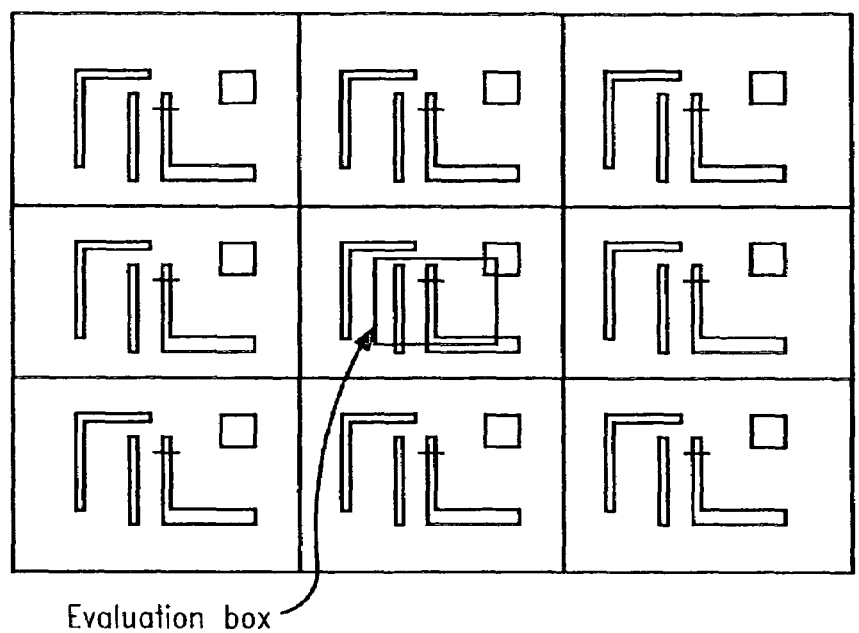
FIG. 12 is a schematic depicting the spatial extent of the short range and mid-range calculation.
Figure 12B:
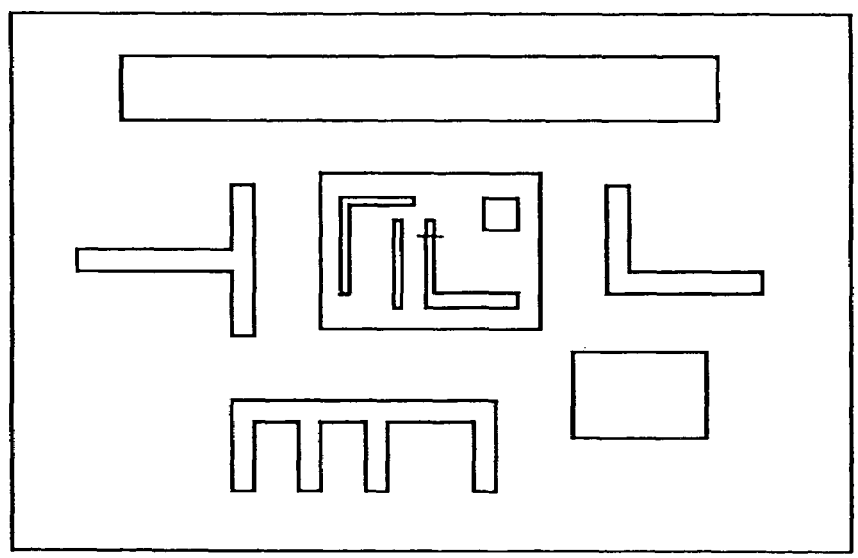

In FIG. 11, the total mask M is divided into M1 and M2. M2 is shown as a rectangle of size defined by $R_{mid}$. Mask M1 denotes the rest of the mask. Each grid point $x_k$ on M1 has an average density $\rho_k$. Mask M2 shows polygons 114 inside a range defined by $+/-R_{mid}$. Polygons that overlap both M1 and M2 need to be clipped and pinned on the boundary, like the rectangle 116 in the upper right corner. M3 is the mask portion that needs to be subtracted later to avoid double counting. FIG. 12 is a schematic depicting the spatial extent of the short range and mid-range calculation. FIG. 12A shows that usually a guard band is required outside the evaluation region for the short-range calculation, thus determine the periodicity parameter in the calculation to satisfy the pseudo-periodic requirement. FIG. 12B shows that for the same evaluation box, we need to include a larger area for intermediate range calculation since the extent of the kernel is much larger.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of performing model-based optical proximity correction comprising:
    calculating a finite integral for each sector of a mask polygon having defined corners
        to determine sector contributions from vertices of said mask polygon;
    integrating on a finite shape in said sector;
    summing up the contribution of said sectors of said mask polygon; and
    calculating interaction effects from said finite integral calculation.

2. The method of claim 1 wherein said finite shape comprises at least two triangles.

3. The method of claim 2 including using a triangle convolution on unbounded sectors.

4. The method of claim 2 including using a triangle convolution on a power-law incoherent kernel.

5. The method of claim 4 comprising reducing said triangle convolution to an analytic expression that contains an incomplete beta function to facilitate numerical integration.

6. The method of claim 5 further comprising determining a minimum radius, $R_{min}$, such that said convolution does not double count any contribution from inside a ROI.

7. The method of claim 6 including providing a rule for a positive or negative sign of said contributions, comprising:
assigning said sign of a first triangle to +1 for two partitions on a side of a first edge that are inside a sector and for said partition opposites, otherwise assigning said sign of said first triangle to −1;
assigning said sign of a second triangle to said sign of said first triangle if said first and second triangle does not overlap, otherwise assigning said sign of said second triangle to the opposite of said sign of said first triangle.

8. The method of claim 6 including analytically defining a hole in a flare kernel having said radius $R_{min}$ and treating any contributions from said flare that are within $R_{min}$ with a partial coherent bilinear convolution.

9. The method of claim 8 further including having said radius $R_{min}$ approximately equal to $\lambda/NA$.

10. The method of claim 1 including integrating in each of said corners of said polygon.

11. The method of claim 1 wherein said step of calculating said interaction effects includes integrating over a coarse grid of a plurality of mask polygons.

12. A method of extending lithographic simulation integrals to include intermediate-range and long-range distance scales, said method comprising:
dividing and decomposing at least two mask polygons into sectors made up of triangles having corners and edges;
performing a distance scale calculation from corners of a plurality of said at least two mask polygons;
implementing a polygon pinning algorithm;
performing a triangle convolution of said plurality of mask polygons;
combining contributions of said sectors to yield a convolution of said plurality of said mask polygons;
combining said plurality of said mask polygons; and
computing an aerial image for optical proximity correction from said combined sector contributions.

13. The method of claim 12 wherein said step of performing a distance scale calculation includes performing finite integrals from semi-infinite corners of said mask polygon.

14. The method of claim 12 further comprising:
calculating contributions from said each of said polygons at an image sample point;
converting area convolution into a position vector dependent integral around a feature perimeter using first and second position vectors;
assigning a resultant indefinite integral for said edges, such that a contribution from an edge between vertices of said first and second position vectors is a difference of indefinite integrals evaluated at each position vector; and
parameterizing said resultant indefinite integral as function of an orientation of said edge, a perpendicular distance from said position vector to said edge, and a polar angle defined from said first position vector to said second position vector.

15. The method of claim 14 including providing a rule for a positive or negative sign of said contributions.

16. The method of claim 15 wherein said rule is adapted for said sectors including six basic sectors comprising 45-degree and 90-degree sectors.

17. The method of claim 15 including storing values of said convolution in a first look-up table for various values of said position vectors.

18. The method of claim 15 wherein said rule comprises:
assigning said sign of a first triangle to +1 for two partitions on a side of a first edge that are inside a sector and for said partition opposites, otherwise assigning said sign of said first triangle to −1;
assigning said sign of a second triangle to said sign of said first triangle if said first and second triangle does not overlap, otherwise assigning said sign of said second triangle to the opposite of said sign of said first triangle.

19. The method of claim 18 including storing said signs of said triangle convolutions within a second look-up table, said second table having a row index and a column index, such that said row index is assigned for said first edge of said sector and said column index assigned for a second edge direction, uniquely specifying said sector type, said row and column indices determined for any sector in consideration, based on said first and second edge directions.

20. The method of claim 19 including having first and second sign matrices, Mat1(edge1, edge2) and Mat2(edge1, edge2), for said second look-up table, said matrices expressed as a function of said first and second edges, such that said first sign matrix, Mat1(edge1, edge2), determines which of said partitions where said direction vector may lie will have a positive sign for said first triangle, and said second matrix, Mat2(edge1, edge2), determines which of said partitions where said direction vector may lie gives the same sign for said second triangle compared to said first triangle.

21. The method of claim 20 wherein said row and column index of each matrix are given by eight basic partitions comprising: up, down, right, left, up-right, up-left, down-right, and down-left.

22. The method of claim 21 further comprising multiplying said sign by −1 if said sector is convex, or by +1 if said sector is concave.

23. The method of claim 20 wherein said first matrix signifies which subsets of said partitions carry a positive sign or negative sign, such that if said partition matches a matrix entry, said sign of said first triangle convolution is assigned a positive value.

24. The method of claim 23 including having said sign of the second triangle convolution equal to said sign of said first triangle partition within which said direction vector resided, else said sign is opposite said first triangle convolution sign.

25. The method of claim 24 further including adding a constant of integration in an indefinite integral for each edge, such that said constant of integration is independent of said polar angle, said constant of integration allowing for removal of any infinities in contributions from vertices in isolation.

26. The method of claim 25 further comprising having said constant of integration present only in said indefinite integral, vanishing when a difference is taken of said indefinite integral at two endpoints of said edge.

27. The method of claim 25 wherein a contribution from an individual mask polygon that has a plurality of edges is represented by a summation over each edge of said mask polygon such that for each corner of said edge said constant of integration is subtracted from said indefinite integral.

28. The method of claim 25 further comprising resolving singularities that arise from unbounded individual corners by adding constant of integration terms that leave corner contributions finite, such that each corner contribution is a summed flare from a pair of said triangles of said triangle convolution.

29. The method of claim 28 wherein said corner contribution comprises a calculation of a contribution from two of said triangles per vertex, such that said contributions from said triangle convolution gives a net contribution of said mask polygon after summation through all vertices.

30. A program storage device readable by a machine, tangibly embodying a program of instructions executable by the machine to perform method steps for performing model-based optical proximity correction, said method steps comprising:

calculating a finite integral for each sector of a mask polygon having defined corners to determine sector contributions from vertices of said mask polygon;

integrating on a finite shape in said sector;

summing up the contribution of said sectors of said mask polygon; and calculating interaction effects from said finite integral calculation.

* * * * *